(12) United States Patent
Weiler et al.

(10) Patent No.: US 6,936,144 B2
(45) Date of Patent: Aug. 30, 2005

(54) HIGH FREQUENCY PLASMA SOURCE

(75) Inventors: Manfred Weiler, Rheinbreitbach (DE); Roland Dahl, Ockenfels (DE)

(73) Assignee: CCR GmbH Beschichtungstechnologie, Rheinbreitbach (DE)

( * ) Notice: Subject to any disclaimer, the term of this patent is extended or adjusted under 35 U.S.C. 154(b) by 0 days.

(21) Appl. No.: 10/204,686

(22) PCT Filed: Feb. 21, 2001

(86) PCT No.: PCT/EP01/01952

§ 371 (c)(1),
(2), (4) Date: Sep. 18, 2002

(87) PCT Pub. No.: WO01/63981

PCT Pub. Date: Aug. 30, 2001

(65) Prior Publication Data

US 2003/0091482 A1 May 15, 2003

(30) Foreign Application Priority Data

| Feb. 24, 2000 | (DE) | 100 08 483 |
| Feb. 24, 2000 | (DE) | 100 08 484 |
| Feb. 24, 2000 | (DE) | 100 08 485 |
| Feb. 24, 2000 | (DE) | 100 08 486 |
| Feb. 24, 2000 | (DE) | 100 08 482 |

(51) Int. Cl.$^7$ ............ C23C 14/34; C23C 16/00; C23F 1/00; B01J 19/08

(52) U.S. Cl. ............ 204/298.06; 204/298.04; 204/298.08; 204/298.16; 118/723 I; 156/345.4; 156/345.8; 422/186; 422/186.04; 422/186.29

(58) Field of Search ............ 204/298.04, 298.06, 204/298.08, 298.16; 118/723 I; 156/345.4, 345.48; 422/186, 186.04, 186.29, 186.4

(56) References Cited

U.S. PATENT DOCUMENTS

| 4,948,259 A | 8/1990 | Enke et al. ............ 356/382 |
| 4,994,711 A | 2/1991 | Matossian ............ 313/362.1 |
| 5,858,477 A | 1/1999 | Veerasamy et al. ............ 427/562 |

FOREIGN PATENT DOCUMENTS

| EP | 0 597 497 A1 | 5/1994 | ............ H03H/7/40 |
| JP | 03095843 | 4/1991 | ............ H01J/37/08 |
| WO | WO 99/44219 | 9/1999 | ............ H01J/37/32 |

*Primary Examiner*—Steven Versteeg
(74) *Attorney, Agent, or Firm*—Cohen, Pontani, Lieberman & Pavane (57) ABSTRACT

A high frequency plasma source includes a support element, on which a magnetic field coil arrangement, a gas distribution system and a unit for extraction of a plasma beam are arranged. Additionally a high frequency matching network is arranged within the plasma source.

26 Claims, 8 Drawing Sheets

HIGH FREQUENCY PLASMA SOURCE

PRIORITY CLAIM

This is a U.S. national stage of application No. PCT/EP01/01952, filed on Feb. 21, 2001. Priority is claimed on that application and on the following application(s): Country: Germany, Application No.: 100 08 482.6, Filed: Feb. 24, 2000; Country: Germany, Application No.: 100 08 483.4, Filed: Feb. 24, 2000; Country: Germany, Application No.: 100 08 484.2, Filed: Feb. 24, 2000; Country: Germany, Application No.: 100 08 485.0, Filed: Feb. 24, 2000; and Country: Germany, Application No.: 100 08 486.9, Filed: Feb. 24, 2000.

BACKGROUND OF THE INVENTION

1. Field of the Invention

The present invention concerns an apparatus for the efficient excitation of a low pressure gas discharge (plasma). The apparatus generates a highly ionized and charge compensated plasma beam, which is extracted from a very dense low pressure plasma. The properties of the plasma beam (i.e. ion energy, ion current density, composition of the ion beam) can be well controlled and adjusted. A positive or negative particle current can be extracted alternatively in connection with a system extracting electrons or ions selectively.

2. Description of Prior Art

Plasma systems are of high significance for production, processing and treatment of solid state materials in modern technology. There is a special interest in plasma reactors, which produce quasi neutral plasma beams. These plasma reactors, also known as plasma sources, can be used in many applications in plasma processing. These include the growth of thin films, dispersion, etching and cleaning. A plasma beam contains positively charged ions and negatively charged electrons as well as neutral particles. The total positive charge of the ions equals the total negative charge of the electrons and hence the plasma beam is overall electrically neutral. The quasi neutrality of the plasma beam enables deposition and surface treatment of electrically insulating materials, so that no extra apparatus is required for the neutralization of the plasma beam.

Current applications in plasma processing often demand a high fraction of ions in the plasma beam with exactly adjustable ion energy for the formation of the desired chemical bonding. Thus the growth of hard films such as diamond-like carbon (DLC) or cubic boron nitride requires a highly ionized plasma beam with an ion energy of about 100 eV to maximize the fractions of $sp^3$ bonds in the material. These high ion energies are required to overcome the nucleation threshold and to grow a continuous film. The demand for a very high ion fraction in the plasma means that plasmas typically need to be generated at pressures below $10^{-3}$ mbar. A plasma excitation supported by a magnetic field is necessary to generate plasmas at these low pressures, so recombination at the walls of the plasma chamber can be avoided. An efficient excitation of the plasma is the basic requirement for a high plasma density and a high growth and etch rate, so that short and cost efficient processing times can be guaranteed. For economic reason and for high efficiency it is also important that the plasma source can process large area substrates.

There are different systems for plasma supported treatment of solid state surfaces. A fraction of these systems is based on the use of high frequency electromagnetic fields for plasma generation. Most of these systems are based on two plates, cathode and anode; the high frequency power is usually coupled into the plasma capacitively through the cathode. In between the plasma and the two plates a voltage drop exhibits. The voltage of this drop is dependent on the area of the electrodes and the amplitude of the high frequency. To maximize ion bombardment, the substrate is placed onto the cathode. The disadvantage of capacitively coupled high frequency systems is the low plasma density, which is a consequence of the inefficient coupling of the high frequency power into the plasma. At typical pressures of $10^{-3}$ mbar the particle current onto the substrate consists of only 5% of energetic particles. For many applications which demand a high energy ion dominant process this particle current is not sufficient. Further disadvantages of conventional high frequency plasma sources are the broad ion energy distribution, low growth rates and the dependency of other process parameters on the specific environment.

U.S. Pat. No. 5,017,835 discloses a high frequency ion source for generation of large area ion beams. This high frequency source couples the high frequency power inductively into the plasma. The source uses the electron cyclotron wave resonance excitation of a plasma in a tube shaped plasma chamber, which is clamped between a mounting plate and a top plate. A tunable electrical circuit connects the high frequency generator with the load carrying coil. A weak direct current magnetic field is applied across the plasma. On the mounting plate there is an ion optical system, consisting of multiple electrodes, for the extraction of the ion beam.

U.S. Pat. No. 5,156,703 describes a process for the ablation and structuring of surfaces, production of surface doping and for the production of surface layers by particle bombardment from a plasma. The plasma is generated between two electrodes, one of which is connected to a high frequency power source. A quasi neutral plasma beam is extracted through the powered electrode. The energy of the extracted ions is determined by the amplitude of the high frequency voltage between the plasma and the extraction electrode.

M. Weiler et al described in Applied Physics Letters, Vol. 64 (1994), pages 2797–2799, and in Physical Review B, Vol. 53 (1996), pages 1594–1608 the deposition of tetrahedrally bonded amorphous carbon with a plasma beam source, which creates a capacitively coupled magnetic field supported plasma discharge. This source consists of a large, movable high frequency electrode as well as a smaller grid electrode, which is held on ground potential. Across the plasma a hyperbolic static magnetic field is applied. A positive voltage drop exhibits between electrode and plasma and the grounded extraction grid and the plasma. The electrode can be displaced vertically. This alters the effective area of the electrode and thus the positive voltage drop between plasma and electrode which leads to an adjustment of the ion energy. Hence the ion energy can be adjusted, without any change in gas pressure or high frequency power. The innovation of this source is that the ion energy is adjustable by the internal voltage drop, rather than by applying a DC bias to the substrate. Like other capacitively coupled plasma sources, the plasma density of this system below a pressure of $10^{-3}$ mbar is very low.

An improved version of the plasma source was described by M. Weiler in Applied Physics Letters Vol. 72 (1998) pages 1314–1316. The plasma beam is generated by a high frequency (13.56 MHz), inductively coupled plasma discharge with a superimposed transversal static magnetic field. The ion energy can be adjusted by applying a high frequency voltage to an electrode situated behind the plasma.

The U.S. Pat. No. 5,858,477 describes processes and apparatus for the production of protective overcoats on magnetic recording media and other industrial applications, by deposition of tetrahedrally bonded amorphous carbon. One of the systems describes a plasma source, which inductively ionizes a source material in a plasma chamber with an antenna disposed circumferentially about the plasma chamber so as to maintain a plasma in the plasma chamber, the plasma containing ions which comprise carbon. The ions are then energized by applying an alternating potential between a coupling electrode adjacent one end of the plasma chamber and an extraction electrode adjacent another end of the plasma chamber so as to form a stream of ions through the extraction electrode. Magnetic coils for the generation of a rotating transverse magnetic field which homogenizes the plasma beam are placed around the plasma chamber.

One problem of conventional plasma sources is that ion energy and ion current density are not adjustable independently. A further problem of conventional high frequency sources is that a separate high frequency matching network is required. The high frequency matching network feeds the power from the power supply through a cable to the excitation electrode, resulting in power losses. In the matching network of conventional plasma sources there is further the problem that the amplitude of the high frequency voltage and the amplitude of the high frequency current cannot be tuned independently. This means that resonance effects as the electron cyclotron wave resonance or Landau damping can not be used optimally.

SUMMARY OF THE INVENTION

This invention concerns the task to increase the versatility, functionality and efficiency of plasma sources, i.e. to make ion energy and ion current density independently adjustable, as well as to create high plasma densities, high degrees of dissociation and ionization and reduce power losses.

This invention consists of a high frequency plasma source, which can be used for the generation of a quasi neutral plasma beam or an ion beam. The high frequency plasma source consists of a mounting element, on which magnetic coils for the generation of a transverse magnetic field, a gas distribution system to induce the working gas into the plasma chamber and a unit for the extraction of a plasma beam are mounted. In the interior of the plasma source there is further a high frequency matching network to induce high frequency power into the plasma. This high frequency matching network consists of a primary electrical circuit with a fixed and an arbitrary and a variable capacitor and an high frequency air core inductor coil as well as a secondary electrical circuit with a capacitor, a high frequency air core, inductor coil and at least one excitation electrode. Both electrical circuits are coupled inductively by the inductive flux of the high frequency air core inductor coils and additionally are coupled capacitively.

Ion energy, ion current density, degree of dissociation and degree of ionization are adjustable independently of each other in the plasma source described in this present invention. The source uses high frequency (typically 13.56 MHz or 27.12 MHz) to excite the gas discharge. The high frequency is coupled inductively by the mechanism of either electron cyclotron wave resonance or Landau damping into the plasma which is supported by a superimposed magnetic field.

The high frequency matching network, which also reduces power losses, is an integrative part of the plasma source, i.e. it is placed in the interior of the plasma source, and hence no other matching network is necessary. The matching network permits to adjust the ion energy independently of the ion current density over a wide range. When a variable capacitor is used in the secondary electrical circuit, the ion energy can be changed continuously. The high frequency matching network is such, that an independent control over high frequency amplitude and high frequency power is guaranteed. This enables the precise choice of the necessary conditions of the excitation mechanism (ECWR or Landau), so that the plasma can be excited with high efficiency. The innovative plasma source generates very high plasma densities of up to $10^{13}$ cm$^{-3}$, supplies degrees of ionization of up to 50% and shows high degrees of dissociation. The degree of dissociation for diatomic molecules, e.g. oxygen, nitrogen or hydrogen, can reach up to 80%. There is further the possibility that the ion energy can be adjusted independently of the ion current density over a continuous range of 10 to 1000 eV. Thus the innovative plasma source generates a highly ionized and charge compensated plasma beam with well defined characteristics of ion energy, ion current density and composition of the plasma beam. Additionally the homogeneity as well as the freedom of particles is ensured. Thus the long time stability of the plasma source and the control over the process as well as long times between servicing are ensured.

Such a matching network is described in detail in the commonly owned German patent application "High Frequency Matching Network" with the file number 100 08 485.0 of the company CCR GmbH Beschichtungstechnologie. It is submitted concurrently with this application.

The excitation electrode, which excites the plasma inductively and capacitively can be placed inside the vacuum as well as outside. The excitation electrode should be matched to the required plasma beam in size, form and geometry. More than one excitation electrode can be used, they should be arranged with a distance between 10 and 100 mm adjacent to each other inside the vacuum. In the case of more than one electrode being used, generally each electrode is connected to a separated matching network and a separate high frequency generator. This enables the generation of different kinds of plasmas in the different plasma volumes, as well as to control and adjust the beam characteristics of these plasmas independently.

Only excitation electrodes with a number of coil turns $n \leq 1$ are installed. This minimizes the induction of the excitation electrode and hence the high frequency amplitude which drops between excitation electrode and ground via the plasma. Hence the coupling of power into the plasma is mainly inductive. A continuous and applicable capacitive coupling happens via the circuit of the matching network according to the invention.

In general excitation electrodes are manufactured out of metal tubes or grids. If the ion energy is changed by the method of capacitive coupling into the plasma, i.e. by applying additional high frequency amplitude which drops between the excitation electrode and ground via the plasma the resulting maximum ion energy is relatively low. Higher ion energies can not be achieved with excitation electrodes fabricated from general metal tubes or grids. The boundaries of the plasma chamber are generally held at ground potential or connected to high frequency power. The larger the ratio of the area connected to high frequency power to the area held at ground potential, the higher is the maximum ion energy. In the present invention the excitation electrode is the shape of a pipe with a discontinuity for the electrical connections, so that much of the grounded area is replaced by high frequency conducting area. The length of the tube is equal to the maximum length of the plasma chamber. The excitation electrode can adapt the form of a plate or of an tube with a discontinuity. In case of the latter the cross section is preferably circular, sector shaped, quadratic or rectangular.

Power is induced into the plasma by a high frequency power connection. To increase the efficiency of the power induction, a transverse magnetic field, necessary for the excitation of resonance effects, is applied across the excitation electrode and the plasma. The magnetic field can be generated by coils placed around the plasma chamber. These can be placed inside as well as outside the vacuum and can be adapted to the geometry of the plasma chamber. If the coils are used with direct current a static magnetic field results. If the coils are used with alternating current, a rotation of the magnetic field around the long axis of the plasma source can be achieved, if coils next to each other are supplied with phase shifted currents. The magnetic field is then dynamic.

By varying the magnetic field, resonance excitation of the plasma can be achieved by either a standing wave or by fulfilling the requirements for Landau Damping. The refractive index n of the plasma can be varied over a wide range, typically between 50 and 500 by varying the magnetic field strength. To fulfil the Landau condition the phase velocity $c_{pl}$ of the electromagnetic wave must be equal to average velocity $c_e$ of the plasma electrons. The phase velocity is determined by the ratio of the average velocity of the electrons and the refractive index n, which is determined by the electron temperature $T_e$. The equation $c_{pl}=c_e/n=(kT_e/m_e)^{1/2}$ must be valid (where k is Boltzmann's constant and $m_e$ the electron mass).

A stationary transverse field is not homogeneous across the plasma chamber. This leads to locally different excitation efficiencies within the plasma volume and results in locally different plasma densities. Therefore the extracted plasma beam is also inhomogeneous. This can result in a deposition of material with large thickness fluctuations. The inhomogeneity of the transverse magnetic field is therefore mapped on the substrate. The homogeneity of the excitation can be optimized by using a dynamic magnetic field. Instead of using two magnetic coils as for a static magnetic field, for a dynamic magnetic field at least three coils are placed around the plasma chamber. To create the dynamic magnetic field with these coils, alternating current (f<100 Hz) can be used in such a way that the currents in two coils adjacent to each other are phase shifted. This results in a rotation of the magnetic field around the longitudinal axis of the plasma source. This rotation of the magnetic field leads, integrated or summed over a full rotation cycle, to a homogeneous excitation of the plasma. Additionally an improvement of the homogeneity of the plasma by mixing takes place.

An additional improvement of the homogeneity of the extracted plasma beam can be achieved, if on top of the inner coil layer a second layer is placed, so that the middle of a coil in the second layer is across the ends of a pair of coils in the inner layer.

Ideally in any high frequency plasma source magnetic coils, excitation electrodes and the gas inlet system are spatially and geometrically well coordinated with each other.

For the extraction of electrically charged particles (generally ions and/or electrons) from the plasma a unit to extract a plasma beam, also called extraction system, can be placed at the opening of the plasma chamber. In the simplest case an aperture, i.e. a flat plate with an opening to extract the plasma can be used. Another variation is the usage of a grid or a mesh, which is on ground potential. The energy of the ions flowing from the source is then given by the difference between plasma potential and ground potential. The plasma potential can be varied by the high frequency amplitude of the high frequency potential which is applied to the excitation electrode. Thus the kinetic energy of the ions can be varied by the high frequency amplitude.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
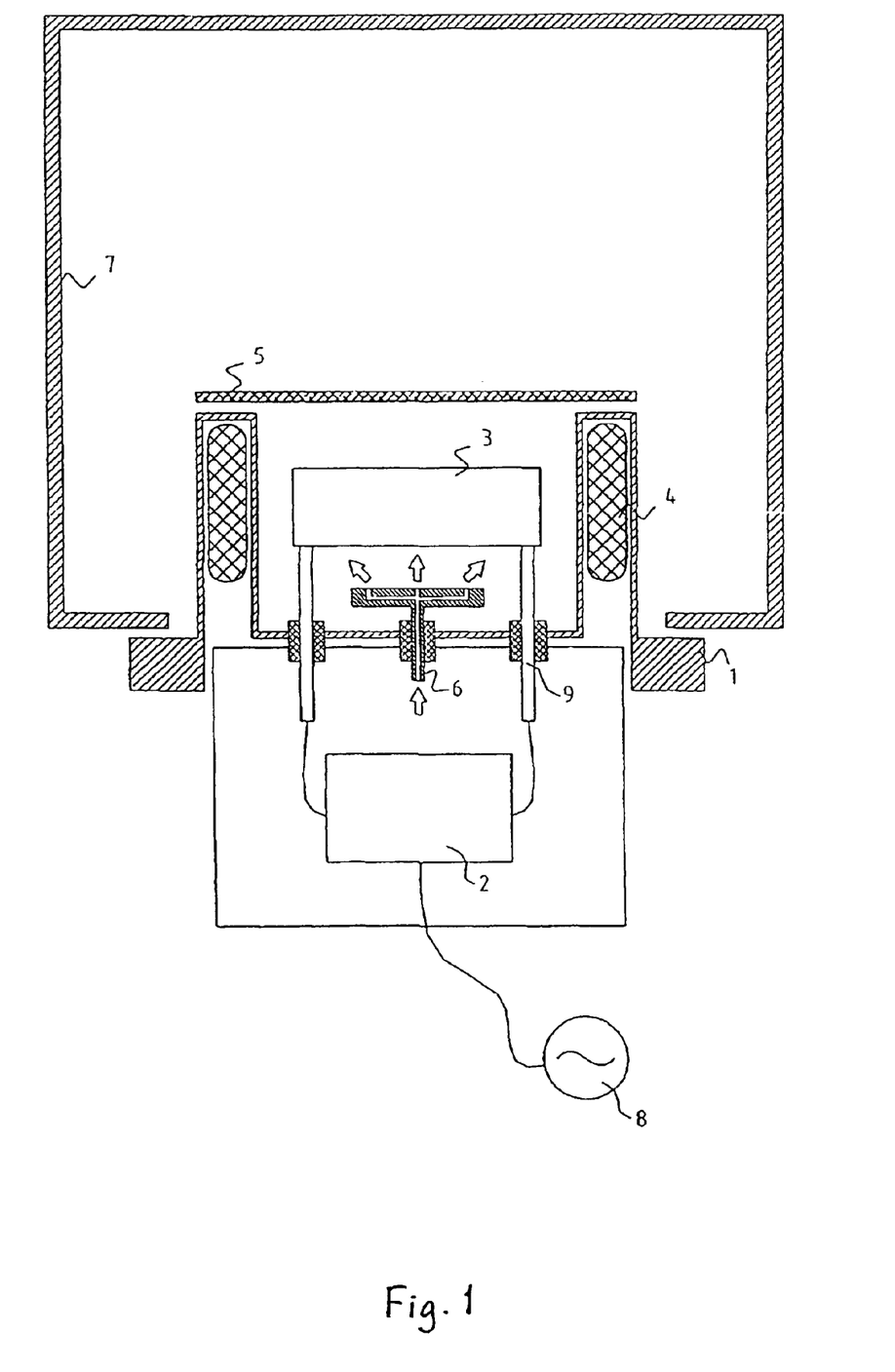
FIG. 1 is a schematic diagram of a plasma source according to our embodiment of the present invention.
Figure 2A:
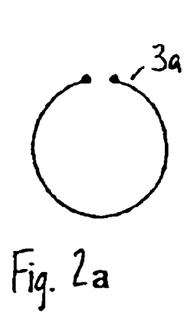
FIGS. 2a–2j are schematic diagrams configurations of an excitation electrode for use with the plasma source of FIG. 1.
Figure 2B:
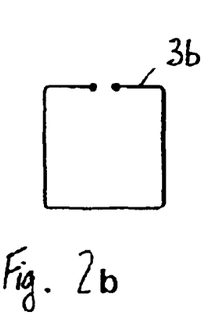
Figure 2C:
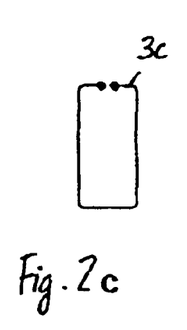
Figure 2D:
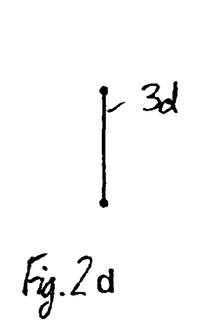
Figure 2E:
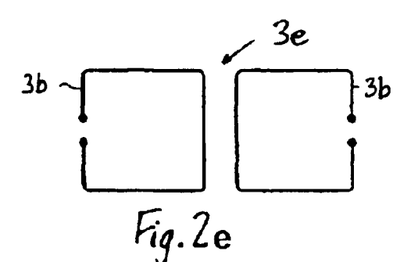
Figure 2F:
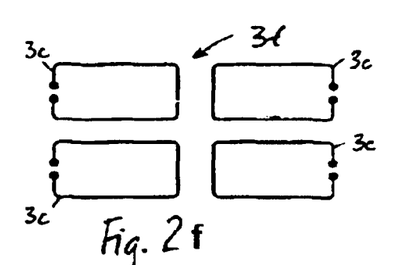
Figure 2G:
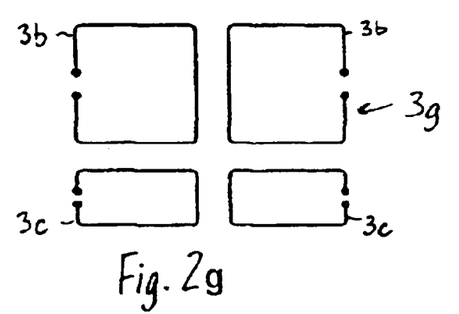
Figure 2H:
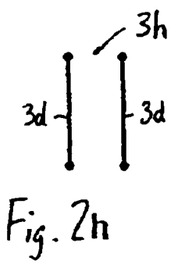
Figure 2I:
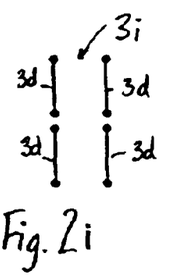
Figure 2J:
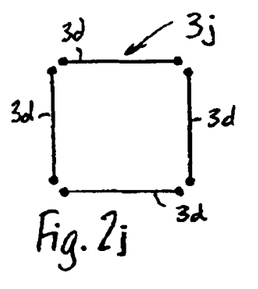

The principal assembly of the plasma source is shown in FIG. 1. The plasma source is assembled of various main components including a mounting element 1, on which an arrangement of various magnetic field coils 4 to generate a transverse magnetic field, a plasma beam extraction unit 5 to extract the plasma beam and a gas distribution system 6 are placed. Additionally in the interior of the plasma source there is a high frequency matching network 2 to match the impedance with the belonging excitation electrode 3 to generate the plasma connected to the mounting element 1. The excitation electrode 3 is situated inside a vacuum defined by mounting element 1 and an outer wall 7 and connected by vacuum current feed-throughs 9 with the main part of the matching network 2. The working gas is led into the plasma chamber by the gas distribution system 6 through the plasma source. The plasma source represents in its assembled state after tuning of all components a closed unit, which can be attached to a flange of a vacuum chamber 7. For the power inlet a high frequency generator 8 is necessary, which frequency is 13.56 MHz. The magnetic field coils 4 are driven in such a way that a rotating magnetic field is generated.

In FIG. 2 different forms and assemblies of the excitation electrodes are shown. Form and size of the excitation electrodes are matched to the desired plasma beam in the cross section. The excitation electrode in the shape of a sector (FIG. 2a) creates a round beam profile; the quadratic excitation electrode (FIG. 2b) creates a quadratic beam profile. The excitation electrode in the shape of a rectangle (FIG. 2c) and the excitation electrode in the shape of a ribbon (FIG. 2d) generate a line shaped beam profile. The exemplary described excitation electrodes can be positioned next to each other at a small distance of 10 to 100 mm in various ways (FIGS. 2e–j).

Figure 3A:
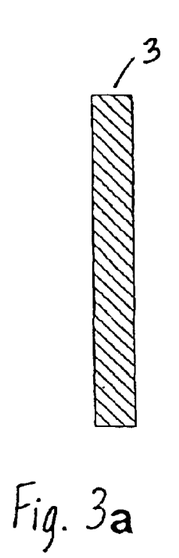
FIGS. 3a–3c are cross-sectional views of respective excitation electrodes according to the present invention.
Figure 3B:
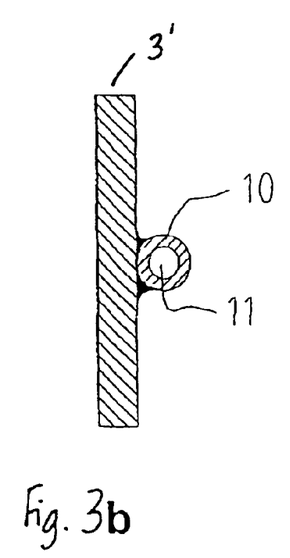
Figure 3C:
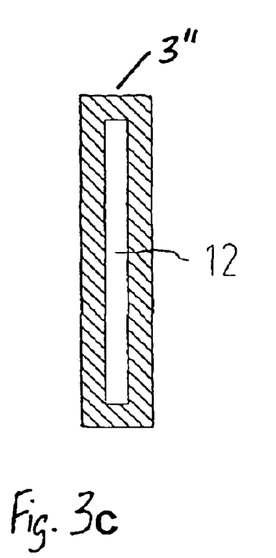

FIG. 3a shows the cross section of a 5 mm wide and 50 mm high tube shaped excitation electrode 3. FIG. 3b shows a variant of the excitation electrode 3'. In this case a tube 10 is connected to the excitation electrode. FIG. 3c shows a further variant of the excitation electrode 3", which is provided with a cavity. For cooling the interior of the tube 11 or of the cavity 12 can be flushed with a liquid medium, preferably water.

Figure 4A:
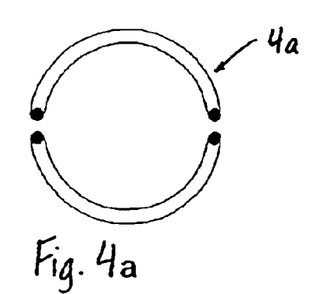
FIGS. 4a–4n are schematic diagrams showing respective configuration of magnetic field coils for use with the plasma source of FIG. 1.
Figure 4B:
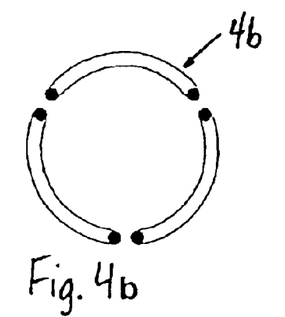
Figure 4C:
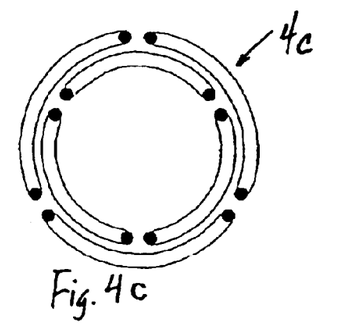
Figure 4D:
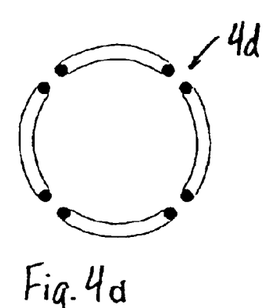
Figure 4E:
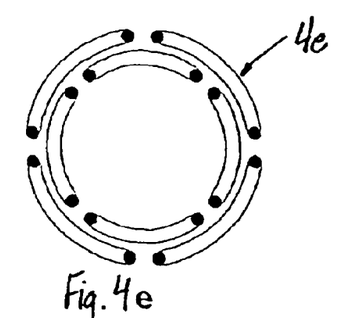
Figure 4F:
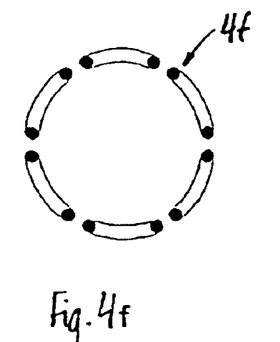
Figure 4G:
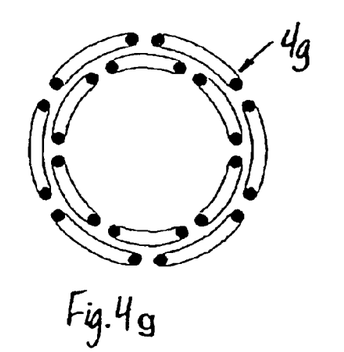
Figure 4H:
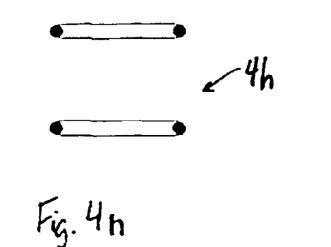
Figure 4I:
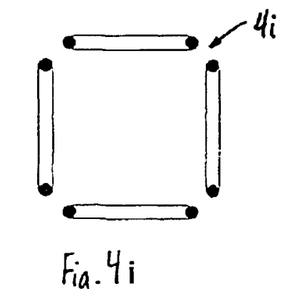
Figure 4J:
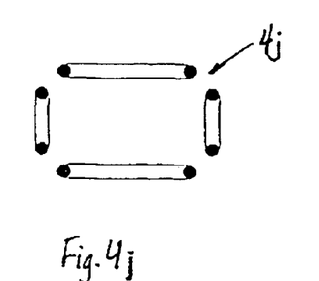
Figure 4K:
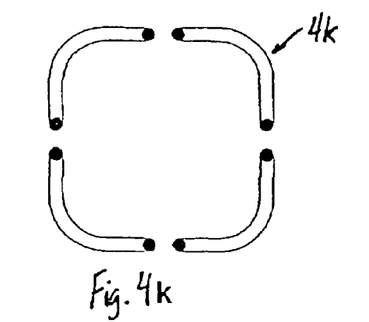
Figure 4L:
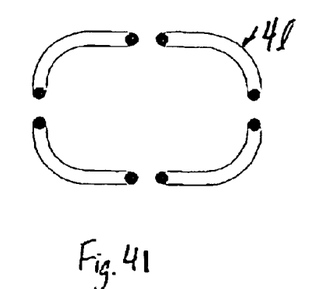
Figure 4M:
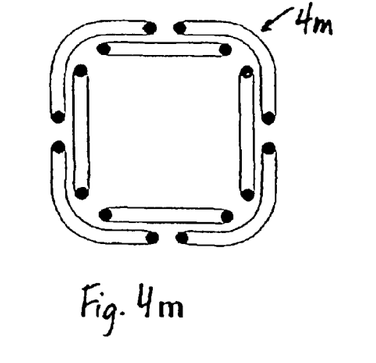
Figure 4N:
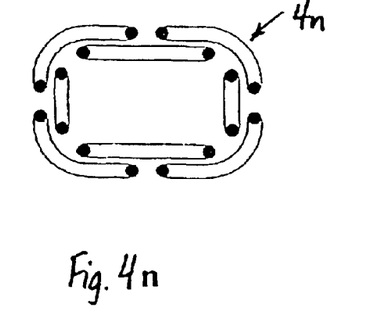

FIGS. 4a–4n show the possible forms and assemblies of the magnetic field coils to generate a transverse magnetic field.

Figure 5:
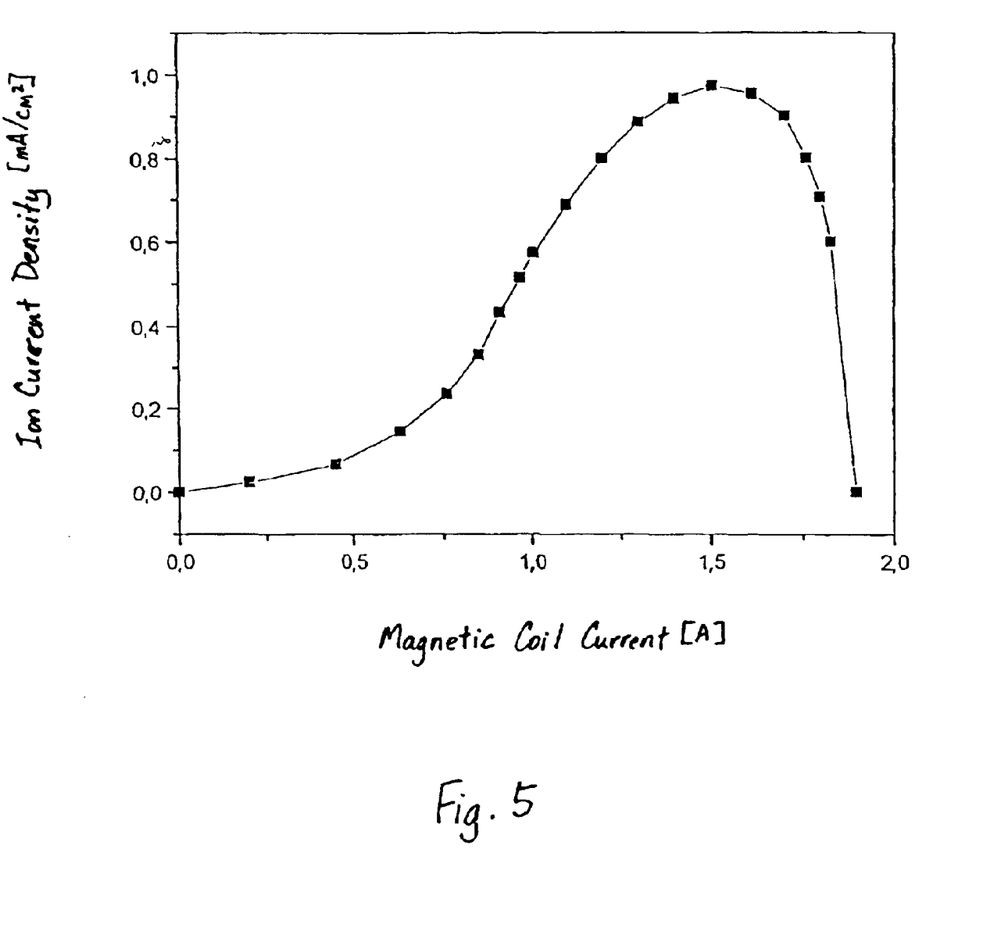
FIG. 5 is a graph of ion current density as a function of magnetic filed strength.

FIG. 5 shows the resonance behavior of the source by plotting the ion current density in dependence of the magnetic coil current for illustrating the Landau damping resonance.

Figure 6A:
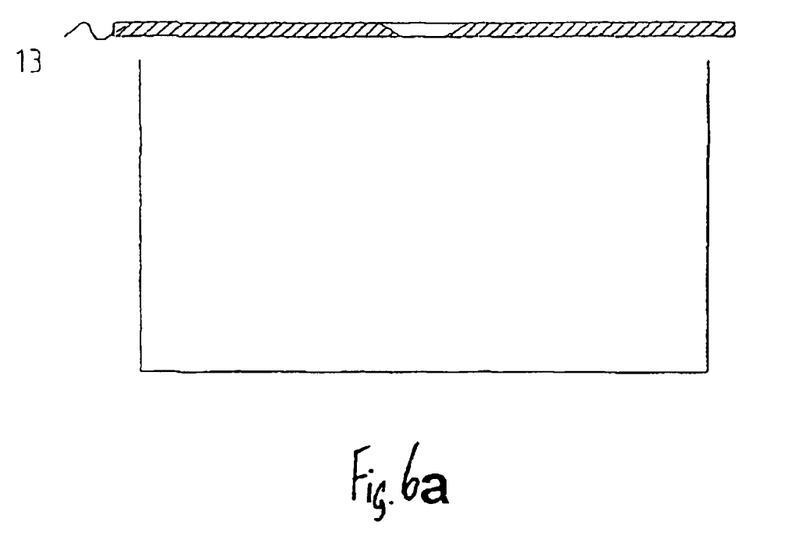
FIGS. 6a and 6b are side views of two respective plasma beam extraction units.
Figure 6B:
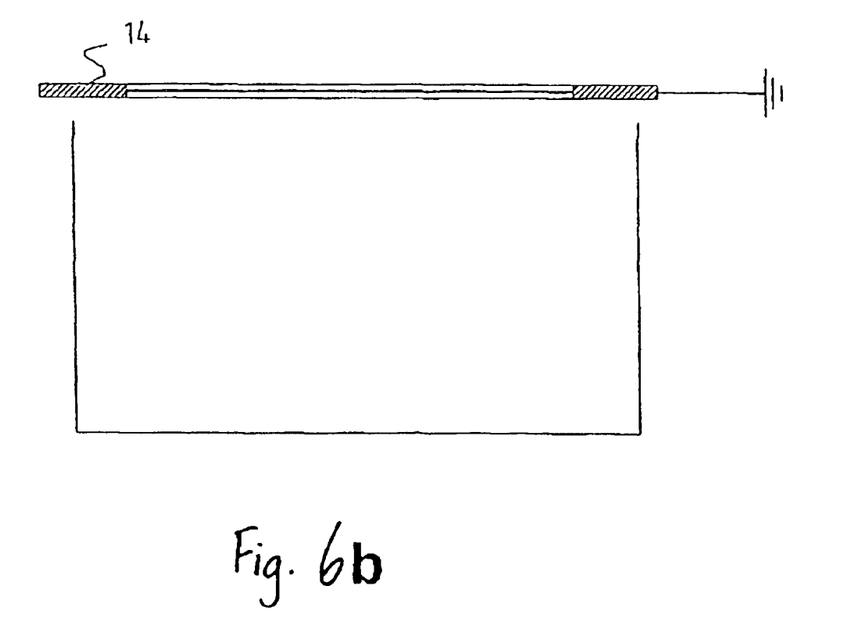

FIG. 6 shows different variants of the extraction system, in the simplest case a flat plate with an opening 13 can be used (FIG. 6a). FIG. 6b shows a mesh 14 which is on ground potential.

Figure 7:
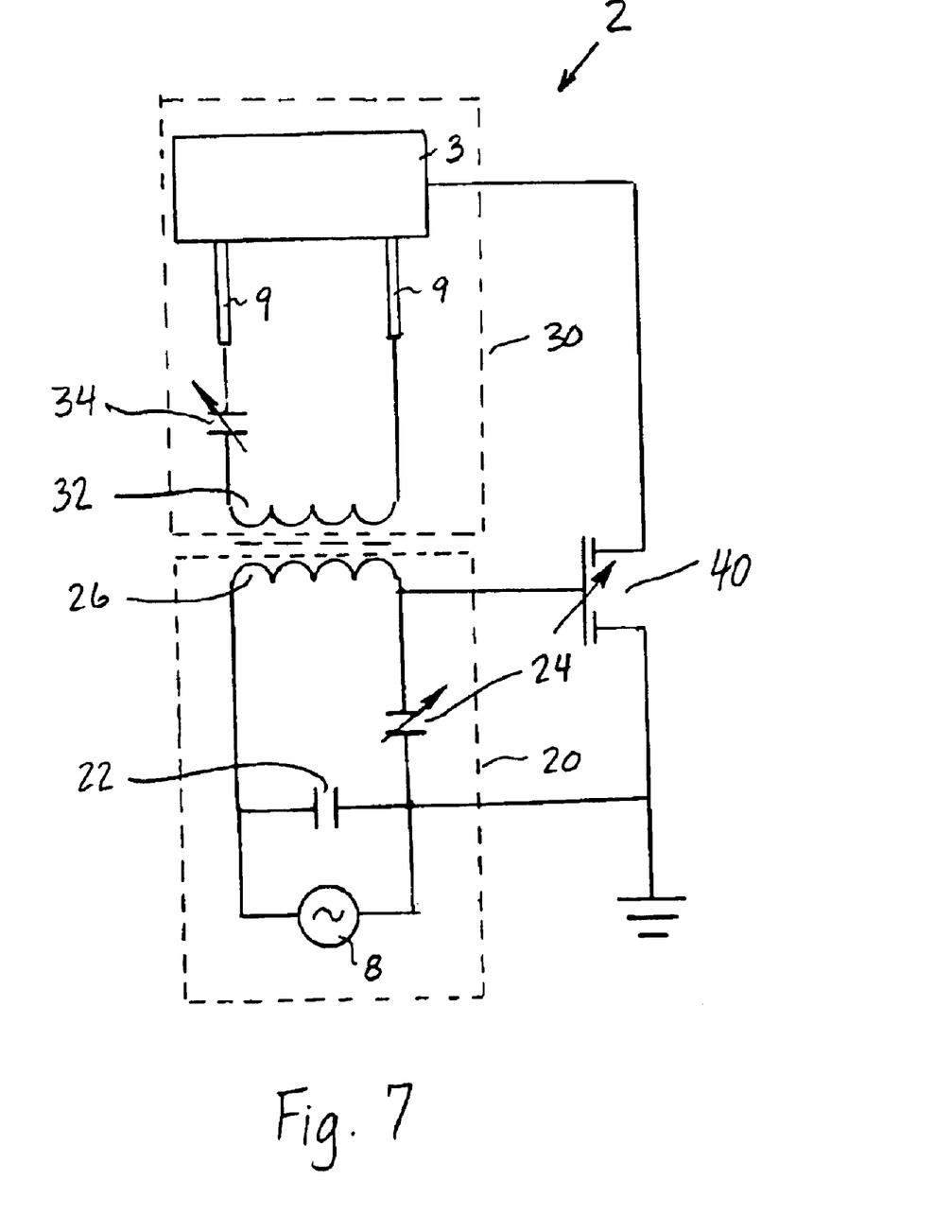
FIG. 7 is a schematic diagram of a high frequency matching network for use in the plasma source of FIG. 1.

As shown in FIG. 7, the high frequency matching network 2 includes a primary electrical circuit 20 and a secondary electrical circuit 30. The primary electrical circuit 20 is connected to the high frequency generator 8 and includes a fixed capacitor 22 and a high frequency air core coil 26 connected across the high frequency generator 8. A variable capacitor 24 is connected in series between one side of the high frequency air core 26 and one side of the fixed capacitor 22. The secondary electrical circuit includes a high frequency air core coil 32 and a variable capacitor 34 connected in series across the excitation electrode 3. The primary and secondary electrical circuits 20, 30 are coupled inductively by the inductive flux of the high frequency air core coils 26, 32. Additionally the primary and secondary electrical circuits 20, 30 are capacitively coupled by a differential-trimmer capacitor 40. FIG. 7 shows one example of the high frequency matching network 2. Of course, other configurations comprising similar functions of variable capacitance and inductive coupling for permitting adjustment of the ion energy independently of the ion current density may also be used.

What is claimed is:

1. A high frequency plasma source, comprising:
   a mounting element;
   a magnetic field coil layout mounted on said mounting element;
   a gas distribution system mounted on said mounting element for introducing a working gas to a plasma chamber area for forming a plasma therein;
   a plasma beam extraction unit mounted on said mounting element; and
   a high frequency matching network arranged in an interior of said plasma source for inducing high frequency power into the plasma.

2. The plasma source of claim 1, wherein said magnetic field coil, said excitation electrode, and said gas distribution system are adjusted to each other spatially and geometrically.

3. The plasma source of claim 1, wherein said plasma beam extraction unit is arranged in front of an opening of the plasma chamber area.

4. The plasma source of claim 3, wherein said plasma beam extraction unit defines an aperture therethrough.

5. The plasma source of claim 3, wherein said plasma beam extraction unit comprises one of a grid and a mesh.

6. The plasma source of claim 1, wherein said plasma beam extraction unit comprises means for generating a quasi neutral plasma beam.

7. A high frequency plasma source comprising:
   a mounting element;
   a magnetic field coil layout mounted on said mounting element;
   a gas distribution system mounted on said mounting element for introducing a working gas to a plasma chamber area for forming a plasma therein;
   a plasma beam extraction unit mounted on said mounting element; and
   a high frequency matching network arranged in an interior of said plasma source for inducing high frequency power into the plasma, wherein said high frequency matching network comprises primary and secondary electrical circuits, said primary electrical circuit having a fixed capacitor, a variable capacitor, and a primary air core inductive coil, said secondary electrical circuit comprising a capacitor, a secondary air core inductive coil and at least one excitation electrode, said primary and secondary circuits being selectively coupled by a coupling including an inductive coupling portion provided by an inductive flux of said primary and secondary air core inductive coils and by a capacitive coupling portion provided by capacitive means connected between said primary and secondary electrical circuits.

8. The plasma source of claim 7, wherein said coupling between said primary and secondary electrical circuits is selectively adjustable between said inductive coupling portion and said capacitive coupling portion.

9. The plasma source of claim 7, wherein the coupling between said first and second electrical circuits is continuously adjustable between said inductive coupling portion and said capacitive coupling portion.

10. The plasma source of claim 7, wherein said mounting element defines a portion of a vacuum chamber and said at least one excitation electrode is arranged inside the vacuum chamber.

11. The plasma source of claim 10, wherein said at least one electrode comprises a plurality of electrodes arranged adjacent to each other and spaced by a distance in the range including 10 to 100 mm.

12. The plasma source of claim 7, wherein a form, size and alignment of said at least one excitation electrode are adjusted to a geometry of a desired plasma beam.

13. The plasma source of claim 7, wherein said at least one excitation electrode is plate-shaped.

14. The plasma source of claim 7, wherein said at least one excitation electrode is pipe-shaped having a discontinuity at which contacts are connected.

15. The plasma source of claim 14, wherein said pipe-shaped excitation electrode has ring-shaped cross section.

16. The plasma source of claim 14, wherein said pipe-shaped excitation electrode has a sector-shaped cross section.

17. The plasma source of claim 14, wherein said pipe-shaped excitation electrode has a square-shaped cross section.

18. The plasma source of claim 14, wherein said pipe-shaped excitation electrode has a rectangular-shaped cross section.

19. The plasma source of claim 7, wherein a transverse magnetic field is superimposed on said at least one excitation electrode.

20. The plasma source of claim 19, wherein said magnetic field coils are arranged around the plasma chamber area to generate the transverse magnetic field.

21. The plasma source of claim 20, wherein said mounting element defines a portion of a vacuum chamber and said magnetic field coils are arranged outside of the vacuum chamber.

22. The plasma source of claim 20, wherein said mounting element defines a portion of a vacuum chamber and said magnetic field coils are arranged inside the vacuum chamber.

23. The plasma source of claim 20, wherein said magnetic field coils are shaped according to the geometry of the plasma chamber area.

24. The plasma source of claim 20, wherein said magnetic field coils include means for receiving a direct current source for generating a static magnetic field.

25. The plasma source of claim 20, wherein said magnetic field coils include means for receiving an alternating current for generating one of a dynamic magnetic field and a rotating magnetic field.

26. The plasma source of claim 25, wherein the generated magnetic field is phase-shifted.

* * * * *